United States Patent
Hirano et al.

(10) Patent No.: US 6,666,392 B2
(45) Date of Patent: Dec. 23, 2003

(54) COMPOSITION FOR SUBSTRATE MATERIALS AND PROCESS FOR THE SAME AS WELL AS A HEAT CONDUCTIVE SUBSTRATE AND PROCESS FOR THE SAME

(75) Inventors: Koichi Hirano, Osaka (JP); Seiichi Nakatani, Osaka (JP); Hiroyuki Handa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 288 days.

(21) Appl. No.: 09/761,175

(22) Filed: Jan. 18, 2001

(65) Prior Publication Data

US 2001/0026863 A1 Oct. 4, 2001

Related U.S. Application Data

(62) Division of application No. 09/505,988, filed on Feb. 17, 2000, now Pat. No. 6,329,045.

(30) Foreign Application Priority Data

Feb. 18, 1999 (JP) .............................................. P11-39803

(51) Int. Cl.$^7$ ................................................ B02C 19/12
(52) U.S. Cl. ............................. 241/21; 241/22; 241/23; 241/25
(58) Field of Search ............................. 241/14, 15, 16, 241/22, 21, 23, 25

(56) References Cited

U.S. PATENT DOCUMENTS

| | | | | |
|---|---|---|---|---|
| 3,648,937 A | * | 3/1972 | Ehrreich | 241/15 |
| 5,854,311 A | * | 12/1998 | Richart | 523/309 |
| 5,909,915 A | | 6/1999 | Okuda | |
| 5,990,222 A | | 11/1999 | Watada et al. | |
| 6,054,222 A | | 4/2000 | Takami et al. | |
| 6,060,150 A | | 5/2000 | Nakatani et al. | |
| 6,329,045 B1 | * | 12/2001 | Hirano et al. | 428/209 |

FOREIGN PATENT DOCUMENTS

JP    8-73621    3/1996

* cited by examiner

*Primary Examiner*—Mark Rosenbaum
(74) *Attorney, Agent, or Firm*—McDermott, Will & Emery

(57) ABSTRACT

A composition for substrate materials according to the present invention includes 70–95 wt. % of inorganic powder and 5–30 wt. % of thermosetting resin composition and is in a finely crushed condition. The composition for substrate materials is prepared, for example, by crushing into fine pieces and mixing the inorganic powder and the thermosetting resin composition. A heat conductive substrate is provided with an insulator body formed by heating and pressurizing said composition for substrate materials and a wiring pattern is provided in such a condition that it is exposed on the surface of the insulator body. A process for manufacturing the heat conductive substrate comprises forming said composition for substrate materials into the insulator body by casting the above mentioned composition for substrate materials into a metal mold to be heated and pressurized so that said thermosetting resin is cured.

9 Claims, 5 Drawing Sheets

F I G. 3
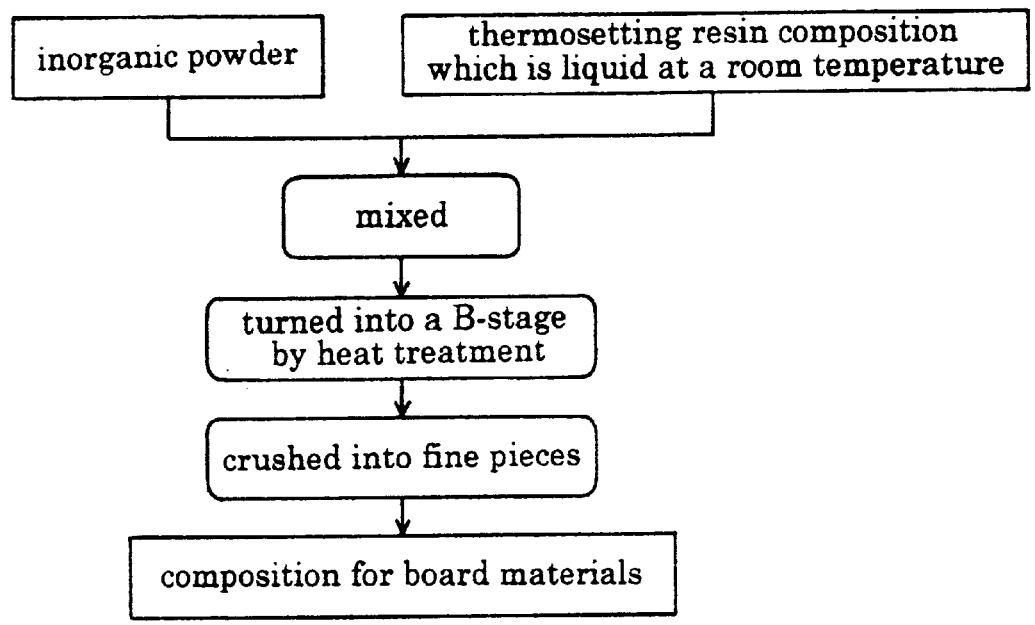
F I G. 4
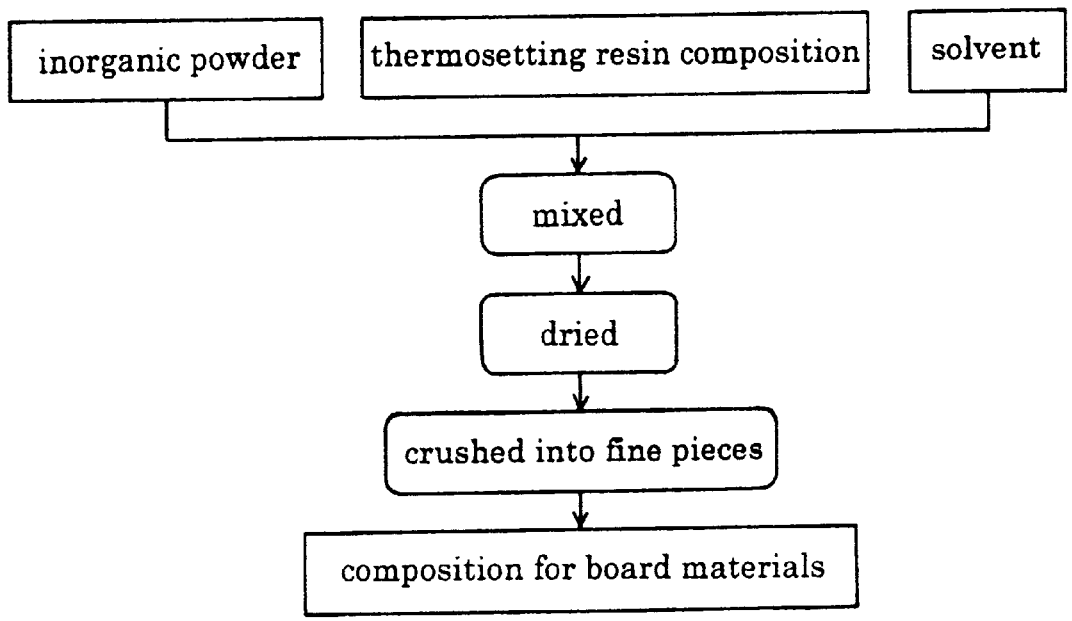

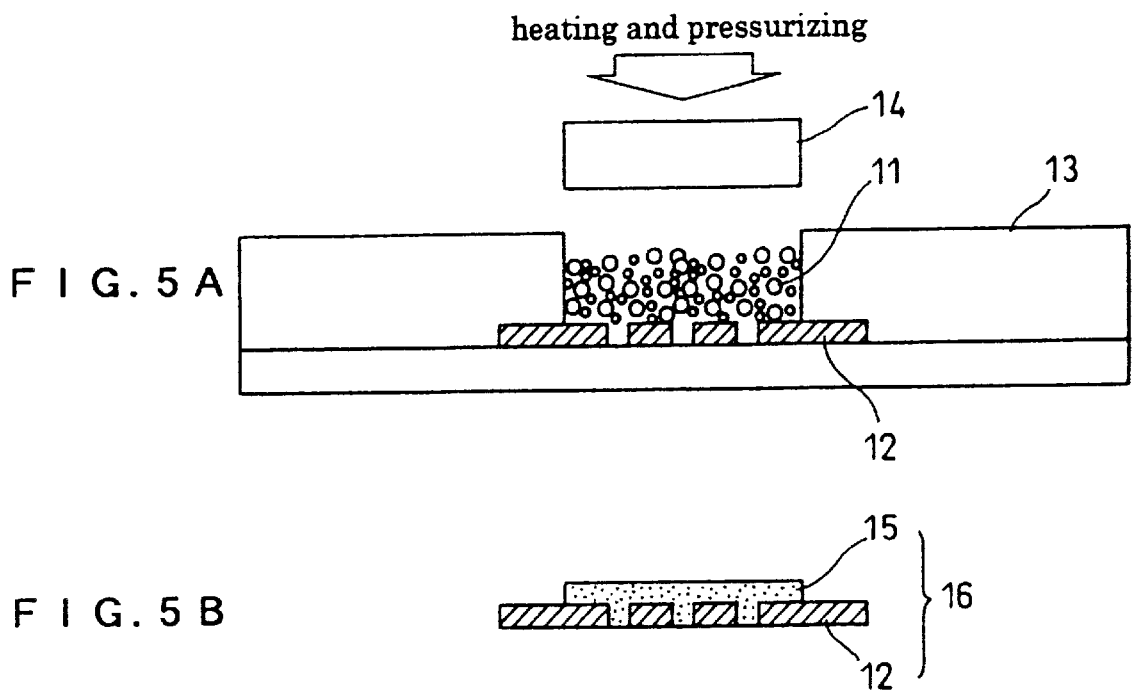
FIG. 5A
FIG. 5B
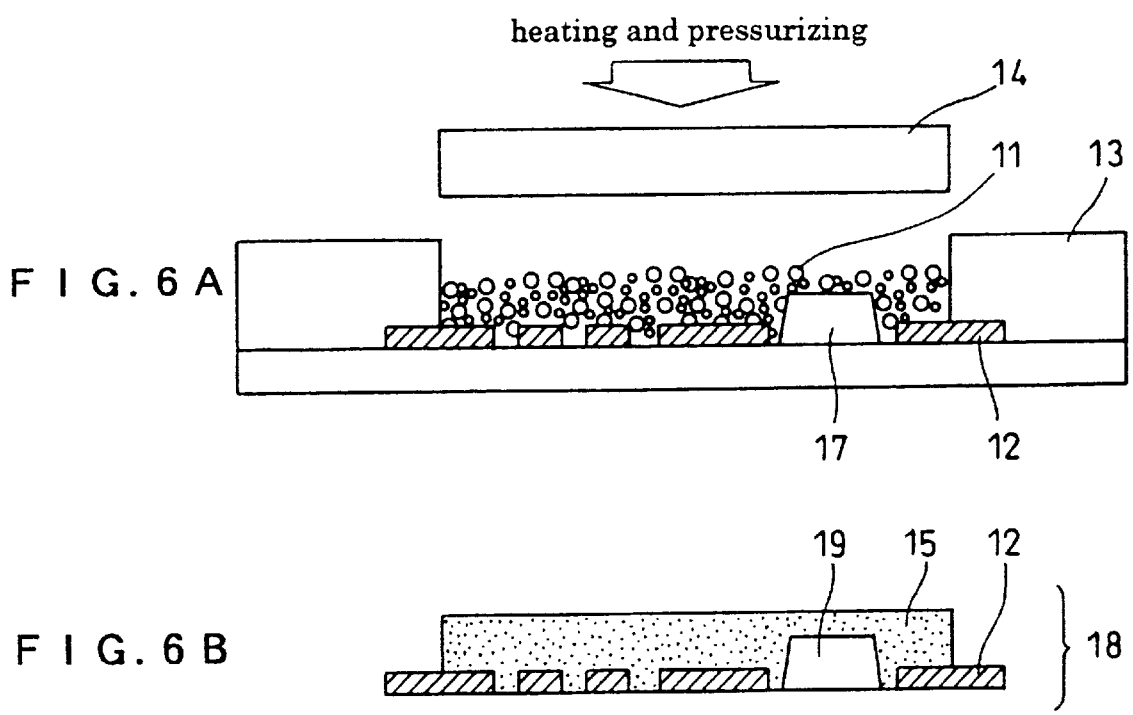
FIG. 6A
FIG. 6B

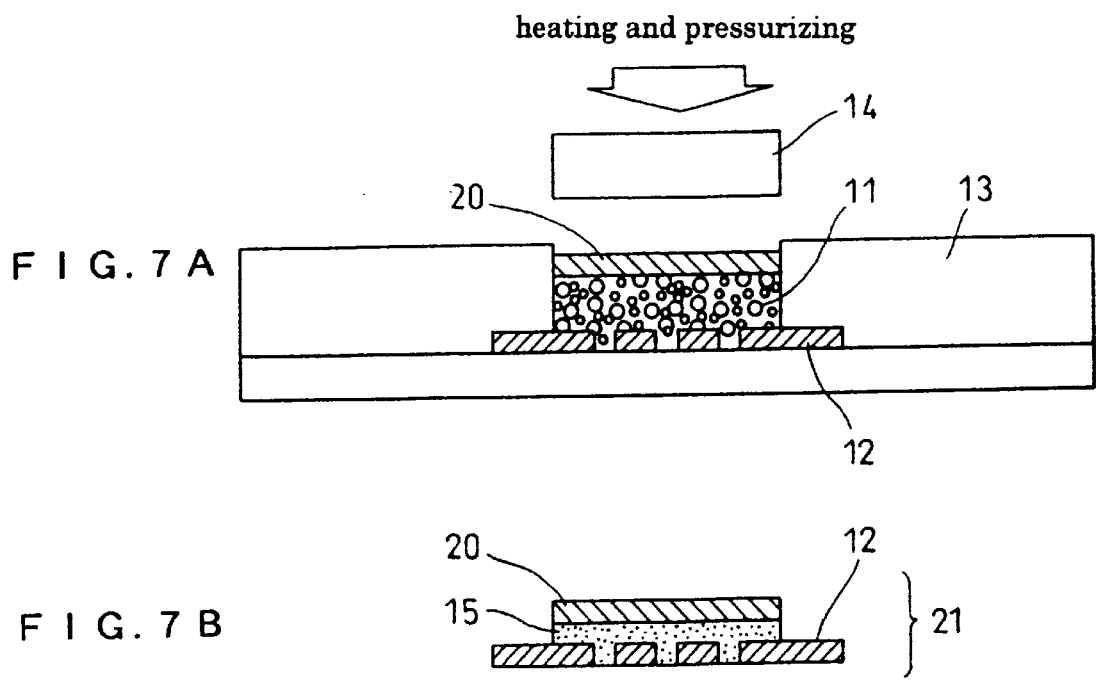
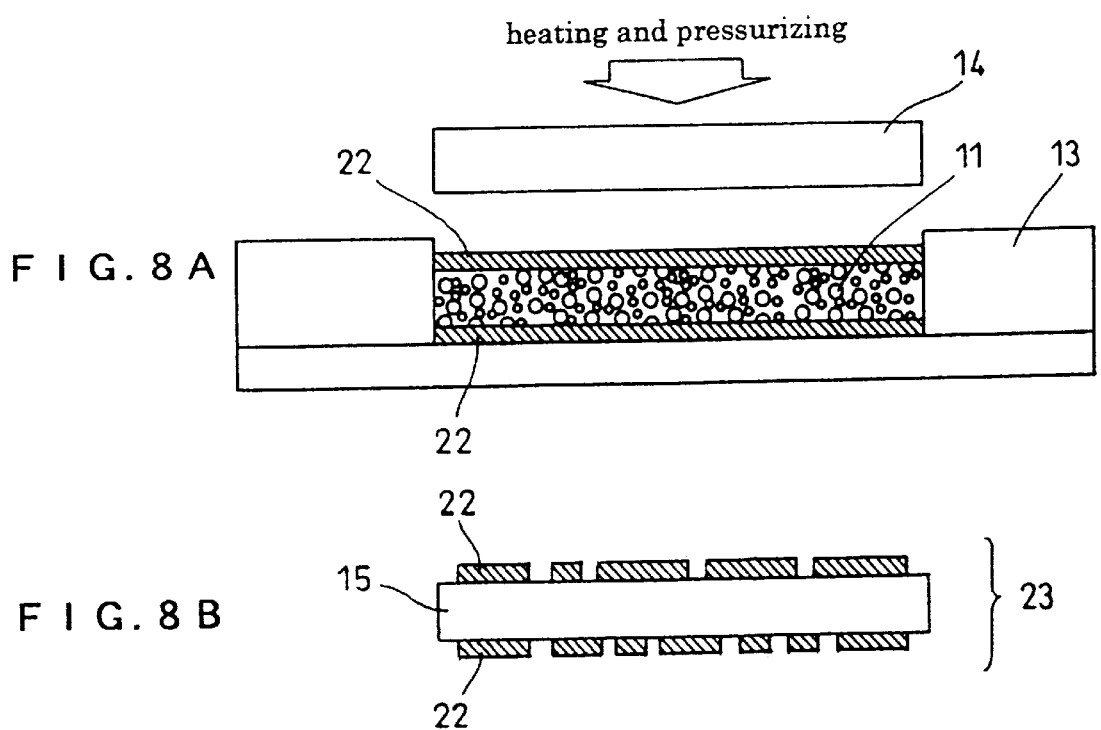

COMPOSITION FOR SUBSTRATE MATERIALS AND PROCESS FOR THE SAME AS WELL AS A HEAT CONDUCTIVE SUBSTRATE AND PROCESS FOR THE SAME

This application is a Divisional of application Ser. No. 09/505,988 filed Feb. 17, 2000, now U.S. Pat. No. 6,329,045 issued Dec. 11, 2001.

BACKGROUND OF THE INVENTION

1. Field of the Invention

The present invention relates to a composition for substrate materials and process for the same, as well as a heat conductive substrate and process for the same, particularly to a technology for gaining a heat conductive substrate preferably utilized in the field of power electronics.

2. Description of the Related Art

Accompanying with the increased performance or miniaturization of electronic equipment, it is desired for semiconductor devices or electronic parts to be designed more densely or to be improved in performance. It is also desired for circuit substrates on which semiconductor devices or electronic components are mounted to be designed more densely and more miniaturized. Therefore it has become important to design a circuit substrate taking account of heat radiation. The following is an example of a heat conductive substrate which is a circuit substrate improved in heat radiating performance. This heat conductive substrate has a configuration where the wiring pattern is formed through an insulator layer on one or two sides of a metal plate such as copper or aluminum. In the following, this heat conductive substrate is referred to as a insulated metal substrate.

On the other hand, as an example of a heat conductive substrate improved in the heat radiating performance there is a heat conductive substrate in which a copper plate is integrated with a ceramic substrate formed of alumina, aluminum nitride or the like. In the following such a heat conductive substrate is referred to as a metal-attached ceramic substrate.

As for a metal-based substrate, it is preferable to make the insulator layer thinner to secure a better heat radiation. To make the insulator layer thinner, however, leads to disadvantages such that it becomes more susceptible to the effect of the noise or it becomes more difficult to secure enough withstand voltage against insulation.

And metal attached ceramic substrate can only be utilized for high current because of the reason that a manufacturing cost is higher compared to that of a metal-based substrate, therefore it is general to use a metal-based substrate for other objects.

In this way, it is difficult to achieve metal-based substrates and metal-attached ceramic substrates which satisfy both functions and manufacturing costs.

Therefore, in recent years, the following manufacturing process of heat conducting substrates is proposed. First of all, a resin composition where an inorganic filler with heat conductivity is filled up in a thermoplastic resin is prepared. And by injection molding and integrating this resin composition and a lead frame, a heat conductive module-type heat conductive substrate is formed.

Though a heat conductive module type heat conductive substrate manufactured in this manner can be secured in the mechanical strength better than that of metal-attached ceramic substrate, there occurs a disadvantage that heat radiation is worse because it is difficult to fill up inorganic filler in high density. The following is the reason why it is difficult to fill up inorganic filler in high density. Too much amount of filler increases the melting viscosity dramatically and makes it difficult to carry out kneading and injection molding. And because the filler works as an abrasive, the aberration of the metal mold is significant.

Therefore, recently, a heat conductive substrate manufactured by forming resin composition filled up with inorganic filler with good heat radiation integrated with a lead frame is proposed, as disclosed in, for example, the Japanese unexamined patent publication H10 (1998)-173097.

This heat conductive substrate is manufactured with the method shown in FIG. 9. That is to say, a mixture slurry including at least some inorganic filler and thermosetting resin is prepared. By forming a film from this mixture slurry a green sheet 31 is manufactured. After drying the green sheet 31, as shown in FIG. 9A, the green sheet 31 and the lead frame 32 are overlapped. After that, the green sheet 31 is cured by heating and pressurizing to produce a heat conductive substrate 34 constructed from a heat conductive cured body 33 and the lead frame 32 attached and integrated together, as shown in FIG. 9B.

In the above mentioned conventional heat conductive substrate 34, however, the following disadvantages occur. First, the green sheet 31 cannot be arranged without forming space with the lead frame 32 with the complicated form and the form precision cannot be fully maintained.

Moreover, in order to control the sheet thickness while manufacturing sheets, it is necessary to control and adjust the viscosity of the mixture slurry and a film-forming device, and work for that is difficult.

In addition, the sheet cutting process such as die punching using a metal mold for the convenience of processing sheets into a desired shape is indispensable, and therefore the processes have increased to raise the manufacturing costs.

In addition, the sheets cut off from the necessary parts cannot be utilized and they become dispensable, so it is not only disadvantageous from the point of cost effectiveness but also the resource is not utilized effectively.

SUMMARY OF THE INVENTION

Therefore, the main object of the present invention is to provide a heat conductive substrate with excellent heat radiation that is possible to be formed into a complicated form and the process for the same.

Another object of the present invention is to provide a process for a heat conductive substrate where control of mixture slurry or a film-forming device as well as sheet processing or the like are unnecessary.

Still another object of the present invention is to provide a composition for substrate materials configured such that a heat conductive substrate can be manufactured easily and economically as well as the manufacturing process for the same.

To achieve the above-mentioned objects, a composition for substrate materials of the present invention includes 70–95 wt. % of inorganic powder and 5–30 wt. % of thermosetting resin composition and is in a condition of crushed fine pieces. By using this composition for substrate materials, by curing the thermosetting resin on condition that inorganic powder is included in high density, a heat conductive substrate with good heat radiation including a high density of inorganic powder can easily be manufactured. Such a heat conductive substrate allows semiconductor devices to be mounted directly thereon, and is extremely preferable as a heat conductive substrate used in the field of power electronics because it has a thermal expansion coefficient in the plane direction very close to that of semi-conductors.

And because the composition for substrate materials is in a condition of crushed fine pieces, it is possible for it to be filled with high precision even in a metal mold of complicated structure under the influence of the finely shaped lead frame or the like. In addition, it is possible to be filled in and be formed with the minimum amount of the composition for substrate materials to cause no waste of the composition for substrate materials. Moreover, such a formation with a high precision can be implemented under the conditions of low temperature and low pressure. The condition of finely crushed pieces is preferably a powder condition or a granulation condition.

It also preferable to coat the inorganic powder with thermosetting resin composition, thereby the adhesive properties between inorganic powder grains would be excellent.

It is also preferable for the thermosetting resin composition to be in a B-stage condition, thereby, as a result of less stickiness of the composition for substrate materials, it becomes easy to be handled.

It is also preferable for the inorganic powder to be at least one kind chosen among $Al_2O_3$, MgO, BN and AlN, thereby it gives the inorganic powder an excellent electric insulation and heat conductivity.

It is also preferable for the grain diameter of the inorganic powder to be within the range of 0.1–100 μm, thereby being able to prevent the heat radiation from lowering. The larger grain diameters of the inorganic powder than this range would lower the density and therefore lowers the heat radiation. On the other hand, too small grain diameters would require to increase resin amount in order to fully contact powder grains with each other as a result of the increased surface area as a whole, which prevents the density from increasing and therefore lowers the heat radiation.

Moreover it is preferable that the thermosetting resin composition includes at least one kind of thermosetting resin chosen from among epoxy resin, phenol resin, cyanate resin as the main component, or that the thermosetting resin composition includes brominated polyfunctional epoxy resin as the main component, and, in addition, includes a bisphenol A-type novolac resin as a curing agent and imidazole as a curing accelerator.

In addition, it is preferable imidazole to be microencapsulated, thereby the storage stability for the composition for substrate materials would be improved because the curing accelerator doesn't react with the thermosetting resin until the formation of the heat conductive substrate.

It is preferable to add to the thermosetting resin composition at least one kind chosen from among a coupling agent, a dispersing agent, a coloring agent and a mold-releasing agent.

According to a manufacturing process of the composition for substrate materials of the present invention, 70 to 95 wt. % of inorganic powder and 5 to 30 wt. % of thermosetting resin composition including thermosetting resin which is in a solid condition at a room temperature are crushed into fine pieces and mixed.

A manufacturing process of a composition for substrate materials according to the present invention includes a process of manufacturing a mixture by mixing 70 to 95 wt. % of inorganic powder and 5 to 30 wt. % of thermosetting resin composition including thermosetting resin which is in a liquid condition at a room temperature and a process for granulating said mixture.

A manufacturing of a composition for substrate materials according to the present invention has a process for mixing 70 to 95 wt. % of inorganic powder and 5 to 30 wt. % of thermosetting resin composition including thermosetting resin which is in a liquid condition at a room temperature and a process for turning said thermosetting resin into a B-stage by heat treating the mixture manufactured in the above process under temperature conditions lower than the curing temperature of said thermosetting resin and a process for crushing into fine pieces said mixture in which said heat setting resin composition is turned into a B-stage.

A manufacturing process of a composition for substrate materials according to the present invention has a process for mixing 70 to 95 wt. % of inorganic powder and 5 to 30 wt. % of thermosetting resin composition including thermosetting resin with solvent in which said thermosetting resin is dissolved and a process for drying the mixture manufactured in the above process at a lower temperature than the curing temperature of the said thermosetting resin to remove said solvent from said mixture and a process for crushing said mixture said solvent is removed from into fine pieces.

According to those manufacturing processes, a composition for substrate materials for manufacturing a heat conductive substrate can be extremely easily manufactured.

A heat conductive substrate according to the present invention has an insulation body formed, by heating and pressurizing, from a composition for substrate materials including 70 to 95 wt. % of inorganic powder having electric insulation and 5 to 30% of thermosetting resin composition and being in a condition of crushed fine pieces. This heat conductive substrate could secure good heat radiation while securing excellent mechanical strength.

It is also preferable for the wiring pattern to be provided on the condition that it is exposed on the surface of said insulator body. Said wiring pattern is preferably a lead frame. It is also preferable that a metal plate for heat radiation is provided on the condition that it is exposed on the surface of said insulator body.

A manufacturing process for heat conductive substrate according to the present invention has the first process where a composition for substrate materials including 70 to 95 wt. % of inorganic powder having electric insulation and 5 to 30% of thermosetting resin composition and being in a condition of crushed fine pieces is cast into a metal mold and the second process where said composition for substrate materials is formed into an insulator body by heating and pressurizing said composition for substrate materials within the metal mold to cure said thermosetting resin.

According to this manufacturing process, it is possible to manufacture a heat conductive substrate having complicated shape easily and with high precision without requiring control of slurry or a film-forming device, sheet processing or the like.

It is preferable that the pressure in which said composition for substrate materials are heated and pressurized is within the range of 1 to 20 MPa.

It is preferable that the temperature in which said composition for substrate materials are heated and pressurized is within the range of 140 to 260° C.

It is preferable that, in said first process, said composition for substrate materials is cast into said metal mold while arranging a lead frame in the metal mold in advance and, in said second process, said insulator body and lead frame are formed and integrated by heating and pressurizing said composition for substrate materials. Or it is preferable that, in said first process, a lead frame is arranged in said metal mold in which said composition for substrate materials are cast and, in said second process, said insulator body and said lead frame are formed and integrated by heating and pressurizing said composition for substrate materials. By doing those processes, the composition for substrate materials goes into the gaps created by the lead frame having microstructured and complicated form so that the insulator body and the lead frame are surely integrated. In addition, it is possible to form with minimum amount of composition for substrate materials filled in so that no waste results from the composition for substrate materials. In addition, because such a formation can be carried out under the conditions of low temperature and low pressure, not only is it economical but it also has the following advantages.

In an injection mold or the like which is a general forming method, extremely large injection pressure is applied so that the resin should be spread into every corner of the metal mold. Therefore, in case a heat conductive substrate with a lead frame is formed by injection mold or the like, the resin reaches onto the surface of the lead frame, which makes it necessary to set up a process for removing this extra resin after the forming process.

Contrary to that, because the composition for the substrate materials has a form of finely crushed pieces, the composition for substrate materials can be spread into every corner including the gaps with the lead frame by applying little pressure on casting the composition for substrate materials into the metal mold. Therefore, extra resin would not go onto the surface of the lead frame exposing the insulator body. Accordingly it is not necessary to have a process for removing such extra resin.

To resolve the disadvantages of the above mentioned injection mold, there is a method to integrate the green sheet described in the prior art and the lead frame. In this method, however, the green sheet cannot be fitted into the parts with complicated forms and the following disadvantages are included.

In a heat conductive substrate, it is desired to have a thick lead frame because of the reason that heat radiation should be enhanced or high current should be applied. In the method using the green sheet, however, the formation precision cannot be maintained when the lead frame is thick because the heat conductive substrate is manufactured by pushing the green sheet into the gap with the lead frame.

On the contrary, according to the present invention, the composition for substrate materials can be spread into every corner in the gaps created by a thick lead frame because finely crushed composition for substrate materials is cast into a metal mold so that it can be applied for a thick lead frame.

It is preferable that, in said first process, a metal plate for heat radiation is arranged within said metal mold in which said composition for substrate materials is cast and, in said second process, said composition for substrate materials is heated and pressurized to mold integrally said insulator body and said metal plate. Or it is preferable that, in said first process, a metal plate for heat radiation is arranged in advance within the metal mold and then said composition for substrate materials is cast into the metal mold and, in said second process, by heating and pressurizing said composition for substrate materials, said insulator body and said metal plate are molded integrally. In this manner, the metal plate for heat radiation is integrated into the insulator body.

Moreover, in the first process, a metal foil is arranged in said metal mold in advance then said composition for substrate materials is cast into the metal mold and, in said second process, by heating and pressurizing said composition for substrate materials, the insulation body and said metal foil are molded integrally and then said metal foil is pattern-processed into a wiring pattern. Or it is preferable that, in said first process, a metal foil may be arranged in the metal mold after the composition for substrate materials is cast therein and in said second process, by heating and pressurizing said composition for substrate materials said heat conductive substrate and said metal foil are molded integrally and then said metal foil may be pattern-processed into a wiring pattern.

It is preferable that said metal foil is copper foils with a thickness of 12 to 200 $\mu$m and is roughened at least on the surface facing the composition for substrate materials. Thereby, the adhesive strength with the insulator body would be enhanced.

Here a room temperature is generally specified to be a temperature range between about −10 to 40° C.

BRIEF DESCRIPTION OF THE DRAWINGS

Other objects of the present invention will be clarified upon understanding the embodiments described hereinafter and be specified in the attached claims. And a number of advantages the present specification does not touch on will be brought to mind by those skilled in the art upon implementing this invention.

FIG. 3 is an explanatory diagram illustrating the third manufacturing process on manufacturing the composition for substrate materials according to the first preferable embodiment;

FIG. 4 is an explanatory diagram illustrating the fourth manufacturing process on manufacturing the composition for substrate materials according to the first preferable embodiment;

FIGS. 5A–5B are explanatory diagrams illustrating the first manufacturing process on manufacturing a heat conductive substrate according to the second preferable embodiment;

FIGS. 6A–6B are explanatory diagrams illustrating the second manufacturing process on manufacturing the heat conductive substrate according to the second preferable embodiment;

FIGS. 7A–7B are explanatory diagrams illustrating the third manufacturing process on manufacturing the heat conductive substrate according to the second preferable embodiment;

FIGS. 8A–8B are explanatory diagrams illustrating the fourth manufacturing process on manufacturing the heat conductive substrate according to the second preferable embodiment.

DETAILED DESCRIPTION OF THE INVENTION

Figure 1:
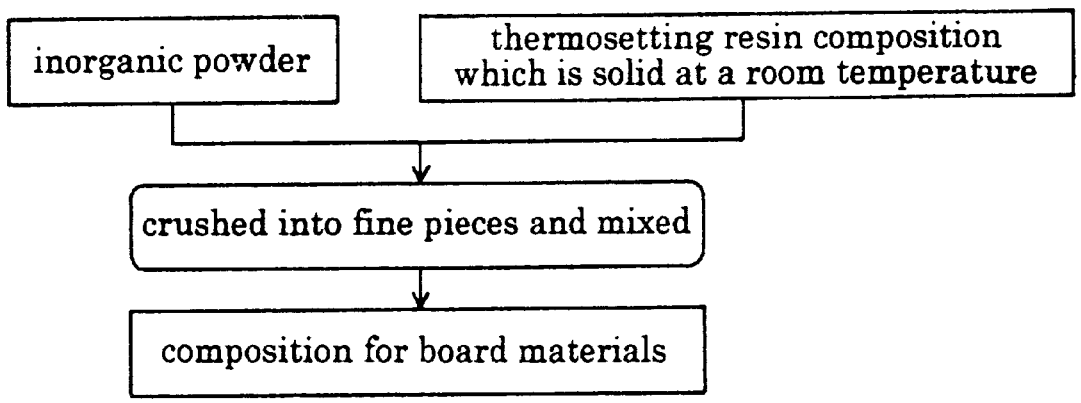
FIG. 1 is an explanatory diagram illustrating the first manufacturing process on manufacturing the composition for substrate materials according to the first preferable embodiment of the present invention.

Preferable embodiments of the present invention are described referring to the drawings in the following.

A composition for substrate materials according to the embodiments comprises a mixture at least including 70 to 95 wt. % of inorganic powder and 5 to 30 wt. % of thermosetting resin composition of which the main component is thermosetting resin. In addition this mixture is processed to be in a powder condition or a granulated powder condition or a granulation condition.

The inorganic powder is preferably coated with a thermosetting resin component and the thermosetting component is preferably in a B-stage condition. In case the inorganic powder is coated with the thermosetting resin composition, the adhesive properties between inorganic powder grains would be excellent. In case the thermosetting resin composition is in a B-stage condition, the handling would be easier as the result of less stickiness of the component for substrate materials. The process manufacturing for the component for substrate materials is determined by the properties and conditions of the mixture. In the same way, the conditions exhibited by this composition for substrate materials after it is processed is determined by the properties and conditions of the mixture.

Because of the following reasons the amount of the inorganic powder in the composition for substrate materials is 70 to 95 wt. %. In case the amount of inorganic powder is less that 70 wt. %, the heat conductivity of the mixture which is cured by being heated and pressurized is lowered to be improper as a material of a heat conductive substrate. If the amount of the inorganic powder is more than 95 wt. %, the filling amount of the thermosetting resin composition which combines with the inorganic powder is lowered to have a worse mechanical strength and insulation after being cured. Because of the above mentioned reasons, it is preferable for the amount of the inorganic powder to be 70–95%, and more preferable to be 85 to 95 wt. %.

It is preferable for the inorganic powder to be at least one kind chosen from among $Al_2O_3$, MgO, BN and AlN. Those kinds of inorganic powder could secure excellent heat conductivity.

It is preferable for the grain diameter of the inorganic powder to be within the range of 0.1–100 μm. Within this range, the disadvantages would not occur such as deteriorated heat radiation, or wider thermal expansion coefficient difference between a heat conductive substrate and a semiconductor device and the like in a heat conductive substrate manufactured by utilizing this composition for substrate materials.

The thermosetting resin composition includes the following as the main component. That is to say, the thermosetting resin composition includes as least one kind of thermosetting resin chosen from among epoxy resin, phenol resin and cyanate resin. In particular, the thermosetting resin composition includes a thermosetting resin having brominated polyfunctional epoxy resin as the main component. And in this case, the thermosetting resin component may include bisphenol A-type novolac resin as a curing agent, and it may include imidazole as a curing accelerator. Here imidazole is preferably micro-encapsulated. The micro-encapsulated imidazole would secure an advantage that the storage stability of the composition for substrate materials is improved. Moreover, it is preferable to add to this heat setting resin component, at least one chosen among a coupling agent, a dispersing agent, a coloring agent and a mold-releasing agent.

A manufacturing process of a composition for substrate materials according to the present embodiment is described based on the process diagrams of FIGS. 1–4 in the following. FIGS. 1–4 illustrate the $1^{st}$ to the $4^{th}$ manufacturing processes respectively applied upon manufacturing a composition for substrate materials.

First of all, the first manufacturing process is described referring to FIG. 1. The first manufacturing process is in the case where the thermosetting resin which is the main component of the thermosetting composition is in a solid state at a room temperature. 70 to 95% wt. of the inorganic powder and 5 to 30 wt. % of thermosetting resin composition are crushed into fine pieces and mixed to be processed into a composition for substrate materials in a homogenized powder condition. In this process, the inorganic powder and the thermosetting resin component may be crushed into fine pieces and mixed by utilizing a ball mill and pulverizer or the like. By doing so, a composition for substrate materials in a homogenized powder condition is gained.

Figure 2:
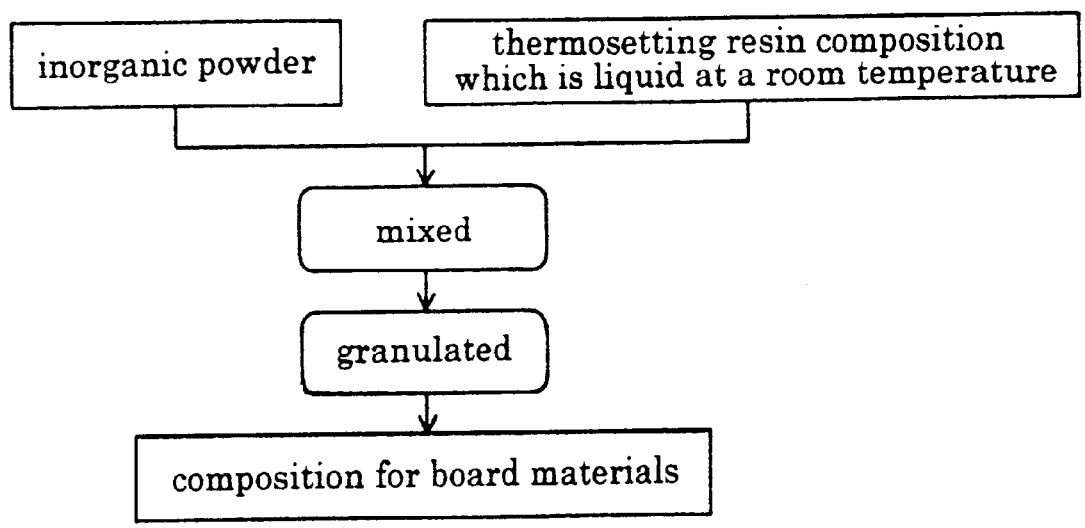
FIG. 2 is an explanatory diagram illustrating the second manufacturing process on manufacturing the composition for substrate materials according to the first preferable embodiment.
Figure 9A:
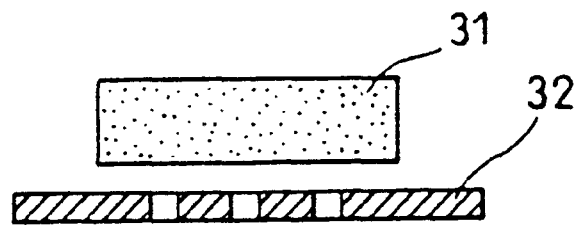
FIGS. 9A–9B are process section views illustrating a manufacturing process on manufacturing a heat conducting substrate according to a prior art.
Figure 9B:
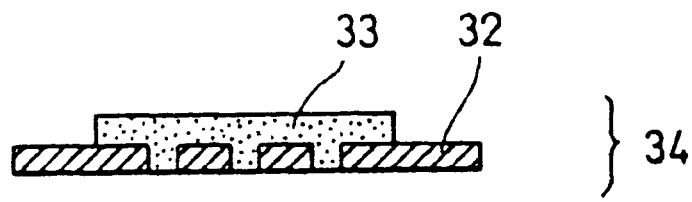

Next the second manufacturing process is described referring to FIG. 2. The second manufacturing process is in the case where the thermosetting resin which is the main component of the thermosetting resin composition is in a liquid condition at a room temperature.

70 to 95 wt. % of the inorganic powder and 5 to 30 wt. % of the thermosetting resin composition are mixed to prepare a mixture. And the prepared mixture is granulated to be formed into a composition for substrate materials in a homogenized granulated powder condition.

According to this manufacturing process, lumps with uneven sizes are generated in the mixture because the thermosetting resin is in a liquid condition. Therefore the composition for substrate materials is granulated by passing it through a mesh or by utilizing other methods to be in a homogenized granulated powder condition. In mixing the inorganic powder and thermosetting resin components, a ball mill, an automated mortar or the like are used.

Next, the third manufacturing process is described referring to FIG. 3. The third manufacturing process is in the case where the thermosetting resin is in a liquid condition at a room temperature in the same way as the second manufacturing process.

First of all, 70 to 95 wt. % of the inorganic powder and 5 to 30 wt. % of the thermosetting resin composition including thermosetting resin in a liquid condition at a room temperature are mixed to prepare a mixture. This mixture is heat-treated under the temperature condition lower than the curing temperature of the heat setting resin to be turned to a B-stage condition. In addition the prepared mixture is crushed and processed into a composition for substrate materials in a homogenized powder condition.

According to this manufacturing process, by turning the thermosetting resin composition into a B-stage condition the composition for substrate materials has less stickiness to be handled more easily. Temperature and time for heat treating the mixture are properly determined in accordance with the tackiness of the mixture and the degree of curing of the thermosetting resin. And it is general to use a ball mill or an automated mortar to crush the mixture into fine pieces after the heat treatment.

Next, the fourth manufacturing process is described referring to FIG. 4. The fourth manufacturing process is a process that can be implemented whether the thermosetting resin as the main component of the thermosetting resin composition is in a solid condition or in a liquid condition at a room temperature.

First of all, a mixture is prepared by mixing 70 to 95 wt. % of inorganic powder and 5 to 30 wt. % of thermosetting resin composition including thermosetting resin together with solvent which can dissolve the thermosetting resin. Then the solvent is removed by drying this mixture under a temperature condition lower than the curing temperature of the thermosetting resin. And the dried mixture is crushed into fine pieces and processed into a composition for substrate materials in a homogenized powder or granulation condition.

This manufacturing process secures the following advantages. First, a composition for substrate materials can be prepared with a certain process without being influenced by the condition of the thermosetting resin. And because good wettability is gained between the inorganic powder and the thermosetting resin composition through the solvent, the thermosetting resin composition can be uniformly adhered to the inorganic powder. In addition, an accompanying with the drying process implemented to remove the solvent, the mixture becomes half-cured condition to be handled easily.

Though any solvent that can dissolve the thermosetting resin composition can be used in this manufacturing process, it is preferable to be at least one kind chosen from among methyl ethyl ketone, isopropanol and toluene, and in general a ball mill, a planetary mixer, a stirring machine or the like are utilized when mixing. And though the temperature and the required time in the drying process can be properly determined in accordance with the degree of solvent residue, tackiness of the mixture, the degree of curing of the thermosetting resin or the like, it is preferable that the temperature is the boiling point of the solvent or more and the curing temperature of the thermosetting resin or less. Moreover for the crushing treatment after the heat treatment, it is preferable to use a ball mill, an automated mortar or the like.

A composition for substrate material according to the present embodiment is where inorganic powder is filled up in the thermosetting resin composition in high density and therefore can be utilized most properly in a process for a heat conductive substrate having a high conductivity.

And in a manufacturing process for a composition for substrate materials according to the present embodiment, thermosetting resin which is in a liquid condition at a room temperature is used, is mixed with the inorganic powder to turn this thermosetting resin into a B-stage so that it can be handled easily. Then a solvent is added to the thermosetting resin composition to be mixed with the inorganic powder. Then, after that, it is dried for the solvent to be removed to gain a composition for substrate materials where the thermosetting resin is adhered well to the inorganic powder.

(The Second Preferable Embodiment)

A heat conductive substrate according to the present embodiment is provided with an insulator body formed by heating and pressurizing the composition for substrate materials described in the first embodiment, and a wiring pattern is formed on the insulator body. It is preferable that the wiring pattern is a lead frame and a metal plate for heat radiation is attached integrally onto the insulator body. It goes without saying that the wiring pattern is not limited to a lead frame but may be a general thing formed by using a metal foil.

A process for manufacturing a heat conductive substrate according to the present embodiment is described in the following based on cross-sectional views showing the process of FIGS. 5–8. Those FIGS. 5–8 respectively show the $1^{st}$–$4^{th}$ manufacturing processes applicable for manufacturing a heat conductive substrate, and a heat conductive substrate with respect to the present embodiment may be manufactured in accordance with those manufacturing processes. And before manufacturing heat conductive substrate with respect to the second embodiment, either one of the manufacturing processes described as the first embodiment should be first carried out to manufacture a composition 11 for substrate materials.

In the first manufacturing process, as shown in FIG. 5A, a predetermined amount of the composition 11 for substrate materials is cast into a metal mold 13 where a lead frame 12 is arranged in advance. Then the composition 11 for substrate materials cast into the metal mold 13 is heated and pressurized with a punch 14. Then the thermosetting resin in the thermosetting resin composition is once softened and then cured while combining inorganic powder grains together. By doing this, the composition 11 for substrate materials is turned into a heat conductive cured body 15. This heat conductive cured body 15 becomes an insulator body. Moreover, the heat conductive cured body 15 is integrated with the lead frame 12 when it is filled into every gap with the lead frame 12 and cured, as a result it becomes a heat conductive substrate 16 shown in FIG. 5B. After processes are continued to modulate it through an electrode terminal process, a solder-resist process, a process for mounting parts or the like, but in those processes well known methods are applied, of which descriptions are omitted.

As for the lead frame 12, an alloy plate comprising, for example, copper, iron or both of them as the main material, is patterned to be utilized. As for the method of patterning, etching, stamping or the like generally used. And those lead frames 12 may be treated on the surface with surface protection treatment such as metal plating. As for the surface treatment materials, nickel, solder, tin, palladium, gold or the like are used. In addition, the pressure for heating and pressuring process is set in the range of 1–20 MPa and the temperature is preferably in the range of 140–260° C. This is because of the following reasons. In case the pressure is smaller than 1 MPa, the density of the heat conductive cured body 15 is lowered with deteriorated hermetic properties and heat conductivity. On the other hand in case it is larger than 20 MPa, the molded heat conductive cured body 15 can easily undergo damage. And in case the temperature for heating and pressurizing process is lower than 140° C., there is a danger that the thermosetting resin cannot be fully cured. On the other hand if it is higher than 260° C. the thermosetting resin may start to be decomposed.

Next the second manufacturing process is described based on FIG. 6. As shown in FIG. 6A, a projecting portion 17 is provided for in advance in the metal mold 13. The lead frame 12 is contained and arranged in this metal mold 13, and then a predetermined amount of the composition 11 for substrate materials is cast into the metal mold 13. The composition 11 for substrate materials cast into the metal 13 is heated and pressurized with the punch 14. Then the composition 11 for substrate materials which was heated and pressurized is cured and molded to the heat conductive cured body 15. This heat conductive cured body 15 becomes an insulator body. Moreover, by integrating the heat conductive cured body 15 with the lead frame 12, a heat conductive substrate 18 is gained as shown in FIG. 6B. A recess portion 19 is formed on the surface of the heat conductive substrate 18 in the place facing the projecting portion 17 of the metal mold 13. This recess portion 19 is for electronic parts or the like to be inserted.

In this way, according to the second manufacturing process, the heat conductive substrate 18 with a complicated shape can be manufactured by using the composition 11 for substrate materials.

Next, the third manufacturing process is described based on FIG. 7. In this manufacturing process, a metal plate 20 for heat radiation is arranged within the metal mold 13 and the metal plate 20 is also combined and integrated with the heat conductive substrate on forming a heat conductive substrate by combining the composition 11 for substrate materials and the lead frame 12.

In the third manufacturing process, as shown in FIG. 7A, a predetermined amount of the composition 11 for substrate materials is first cast into the metal mold 13 in which the lead frame 12 is arranged. After the composition 11 for substrate materials is cast, the metal plate 20 is arranged on the composition 11 for substrate materials within the metal mold 13. Then the composition 11 for substrate materials is heated and pressurized with the punch 14 through this metal plate 20, thereby the composition 11 for substrate materials is cured to be the heat conductive cured body 15. On combining the heat conductive cured body 15 and the lead frame 12, the resulting combination may involve the metal plate 20 to be a heat conductive substrate 21 as shown in FIG. 7B. In this heat conductive substrate 21, the lead frame 12 and the metal plate 20 are integrated with the heat conductive cured body 15. In addition for the metal plate 20, a copper plate or an aluminum plate can be used, and the heat conductive substrate 21 with such a configuration may increase the heat radiation properties or the mechanical strength.

In addition, according to the fourth manufacturing process for manufacturing heat conductive substrate, as shown in FIG. 8A, a predetermined amount of the composition 11 for substrate materials is cast into the metal mold 13 in which the metal foil 22 is arranged in advance. After the composition 11 for substrate materials is cast, a metal foil 22 is arranged on the composition 11 for substrate materials within the metal mold 13. Then through the upper one of the metal foils 22, the composition 11 for substrate materials is heated and pressurized with the punch 14. Then the thermosetting resin in the composition 11 for substrate materials is once softened and then cured while combining inorganic powder grains together. Thereby, the composition 11 for substrate materials turns to the heat conductive cured body 15, which is integrated with the metal foils 22 adhered on both sides of this heat conductive cured body 15. Continuously those metal foils 22 are patterned to form a heat conductive substrate 23 with a wiring pattern formed thereon as shown in FIG. 8B.

As for the metal foils 22, copper foils or the like can be utilized. The thickness of the copper foil is preferable 12–200 $\mu$m. In case the thickness is less than 12 $\mu$m, it is difficult to handle and is easily broken. On the other hand in case the thickness is more than 200 $\mu$m, it becomes difficult to pattern. In addition, the metal foils 22 are preferably roughened on the surface facing the composition 11 for substrate materials. Being roughened would increase the adhesive strength.

The metal foils 22 can be patterned by chemical etching utilizing iron chloride. And it goes without saying that on a completed heat conductive substrate 23, through-holes are formed and then wiring patterns on both sides of the substrate may be electrically connected with each other. A process to be implemented on forming through-holes is for example drilling. And an electric connection method via through-holes can be carried out with a well known method such as metal plating.

In accordance with a process for manufacturing a heat conductive substrate according to the present embodiment, it is possible to integrate the inorganic powder and a lead frame after firmly combining the inorganic powder grains together by curing the thermosetting resin in the composition for substrate materials. Therefore, a heat conductive substrate with high heat radiation can be implemented in a simple manner. And by using a composition for substrate materials according to the present invention, a heat conductive substrate having a complicated shape can be manufactured easily with high precision. And because it is possible to integrate a metal plate for heat radiation at the same time as molding if necessary, the further increased heat radiation of the heat conductive substrate can be implemented.

As describe above, a heat conductive substrate according to the present embodiment could have inorganic powder functioning as a filler placed in high density and therefore could secure a high heat conductivity conventional circuit substrates could not attain. And because a composition for substrate materials in a powder or in a granulation conditions is used, a lead frame and a heat conductive substrate can be integrally molded with high precision even if the lead frame has a complicated shape. In addition such a molding with high precision can be implemented in a simple process. The heat conductive substrate after being cured is rigid, mechanically firm and at the same time has a heat conductivity equal to that of a ceramic substrate, therefore it is useful as a circuit substrate for mounting digital high speed LSIs, which will be used increasingly in the future, for power circuits or those generating high power loss.

The present invention will be described in further detail based on concrete examples of applications as follows.

EXAMPLE OF APPLICATION 1

Alumina bole is added to inorganic powder and thermosetting resin composition in order to increase a dispersal condition, and then the resulting substance is mixed with a ball mill to prepare a composition for substrate materials such as those illustrated in Table 1, that is to say, an Example 1a for comparison and Embodiments 1b–e are prepared. Table 1 shows examples in which the compounding ratio of inorganic powder is varied. As inorganic powder, an alumina powder (trade name: AL-33, made by Sumitomo Chemical Co., Ltd, average grain diameter: 12 $\mu$m) is used. As a thermosetting resin composition, a mixture of epoxy resin which is in a solid condition at a room temperature (trade name: EPICOAT 1010, made by Yuka Shell Epoxy Co., Ltd.) and a curing agent (trade name: CUREZOLE 2MZ, made by Shikoku Chemicals Corp.) with a ratio of 100:5 is used.

TABLE 1

| | Inorganic powder | | Thermosetting resin composition (including a curing agent) | |
| --- | --- | --- | --- | --- |
| Number | Substance name | wt. % | Substance name | wt. % |
| Example 1a for comparison | $Al_2O_3$ | 60 | Epoxy resin | 40 |
| Embodiment 1b | | 70 | | 30 |
| Embodiment 1c | | 80 | | 20 |
| Embodiment 1d | | 90 | | 10 |
| Embodiment 1e | | 95 | | 5 |

Example 1a for comparison and embodiments 1b–e which have compounding compositions in Table 1 are respectively weighed and mixed by rotating it in a pot with a velocity of 1500 rpm for a period of 24 hours after the alumina bole is added. Next, compositions for substrate materials in Example 1a for comparison and Embodiments 1b–e are measured in a predetermined amounts and cast into a metal mold, respectively, and cured under the conditions of 5 MPa and 200° C. to gain a cured body in a plate (thickness of about 0.8 mm). After processing each of the thus gained cured bodies into a predetermined dimension, the heat conductivity, the bending strength and the withstand voltage against insulation are measured. The resultant measurements are shown in Table 2.

TABLE 2

| Number | Heat conductivity (W/mK) | Bending strength (kgf/mm²) | Withstand voltage against insulation (kV/mm) |
|---|---|---|---|
| Example 1a for comparison | 0.8 | 27 | 15 |
| Embodiment 1b | 1.2 | 24 | 14 |
| Embodiment 1c | 1.9 | 22 | 14 |
| Embodiment 1d | 3.5 | 18 | 12 |
| Embodiment 1e | 4.1 | 13 | 9 |

The heat conductivity, the bending strength and the withstand voltage against insulation are found as follows. The surface of a sample cut off 10 mm square is heated by a heater contacted directly on the surface to find the heat conductivity by calculating the way the temperature conveys to the opposite surface. And a test specimen with the width of 15 mm is supported with two points spaced 25 mm apart, of which central part is pressed in a certain velocity so that the bending strength is found by the strength when it is broken. And AC withstand voltage is found in the direction of the thickness of a sample to find the withstand voltage against insulation by calculating the result into that per unit thickness. The bending strength and the withstand voltage against insulation relate greatly to the adhesion between the thermosetting resin compound and the inorganic powder, and in case the wettability between them is poor, microscopic gaps occur between them, and as a result, those characteristics are lowered. Therefore, the bending strength is determined to have enough strength when it is 10 kgf/mm² or more. And since the withstand voltage against insulation for resin only is about 15 kV/mm, it is determined that good adhesion is gained in case the withstand voltage against insulation is 10 kV/mm or more.

By the measurement result of Table 2, the following conclusions are gained. That is to say, a cured body manufactured from each of the compositions for substrate materials of Embodiments 1b–e would gain the heat conductivity which is about 10 times or more as large as that of conventional printed wiring substrate shown as Example 1a for comparison without lowering the bending strength or the withstand voltage against insulation. And in those embodiments, it is ensured that more than double performances (the heat conductivity or the like) can be exercised compared to a conventional injection molding method, though it is not shown. In this way it is understandable that a composition for substrate materials according to the present invention is suitable for an insulation material for heat conductive substrates.

EXAMPLE OF APPLICATION 2

Materials with the composition shown in Embodiments 2a–d in Table 3 respectively are measured and mixed with a ball mill according to the same method as Example 1 after the alumina bole is added. As for inorganic powder, alumina powder is used as was the case in Example 1. As for epoxy resin which is in a solid state at a room temperature, the same resin is used as was the case in Example 1 (including a curing agent), and as epoxy resin which is in a liquid condition at room temperature, EPICOAT 828 (trade name, made by Yuka Shell Epoxy Co., Ltd.) is used mixed with a curing agent (trade name: PN-23, made by Ajinomoto Co., Inc.). In addition, in Embodiment 2d, methyl ethyl ketone (made by Kanto Chemical Co., Ltd.) is added in the proper amount as a solvent. This solvent is later evaporated in the air in the drying process, which does not remain in the composition for substrate materials, and is not included in the compounding ratio calculation.

TABLE 3

| Embodiment number | Inorganic powder | | Thermosetting resin composition (including a curing agent) | | Solvent |
|---|---|---|---|---|---|
| | Substance name | wt % | Substance name | wt % | |
| 2a | Al₂O₃ | 90 | Epoxy resin which is solid at a room temperature | 10 | None |
| 2b | | | Epoxy resin which is liquid at a room temperature | | None |
| 2c | | | Epoxy resin which is liquid at a room temperature | | None |
| 2d | | | Epoxy resin which is solid at a room temperature | | MEK |

In Embodiment 2a, as was the case in Example 1 described above, the composition for substrate materials is gained by rotating and mixing with a ball mill. In Embodiment 2b, in the same way, the mixture gained by rotating and mixing with a ball mill is sieved through 850 μm of opening diameter to granulate and a composition for substrate materials is gained. In Embodiment 2c, the same mixture gained by rotating and mixing is turned to a B-stage by leaving this mixture (thermosetting resin composition) as it is for 10 minutes at 80° C. Then the mixture in a B-stage is crushed into fine pieces in a mortar to gain a composition for substrate materials. In Embodiment 2d, the same mixture is gained by first rotating and mixing with a ball mill and then it is left as it is for 20 minutes at 100° C. to evaporate the solvent in the mixture into the air. And after that the mixture is crushed into fine pieces with a mortar to gain a composition for substrate materials.

Compositions for substrate materials of those Embodiments 2a–d are cured in the same way as Example 1 to prepare cured bodies in a plate, of which the characteristics are measured. The resultant measurements are shown in Table 4.

TABLE 4

| Embodiment number | Heat conductivity (W/mK) | Bending strength (kgf/mm²) | Withstand voltage against insulation (kV/mm) |
|---|---|---|---|
| 2a | 3.5 | 18 | 12 |
| 2b | 3.5 | 19 | 13 |
| 2c | 3.4 | 19 | 14 |
| 2d | 3.7 | 21 | 14 |

According to the result of Table 4, it is understood that a mixture gained by curing a composition for substrate materials is proper as an insulation material for a heat conductive substrate. As for a process for manufacturing a composition for substrate materials, a variety of methods are applicable. Particularly as in the case of Embodiment 2d, it can be understood that the adhesive properties among inorganic powder grains are particularly excellent, and as a result, the heat conductivity is efficient as well as the bending strength and the withstand voltage against insulation are also high.

EXAMPLE OF APPLICATION 3

Using a composition for substrate materials manufactured according to a process of Example 2, Example 3 of a heat conductive substrate integrated with a lead frame is described. In this Example 3, a composition for substrate materials comprising:

inorganic powder: $Al_2O_3$ (trade name: AS-40, made by Showa Denko K.K., spherical grains with the average grain diameter of 12 $\mu$m), 90 wt. part thermosetting resin: cyanate ester resin (trade name: AroCy M30, made by Asahi Ciba Co., Ltd.), 9.5 wt. part other additives: carbon black (made by Toyo Carbon Co., Ltd.) 0.3 wt. part and dispersing agent (trade name: PLYSURF A208F, made by Dai-Ichi Kogyo Seiyaku Co., Ltd.), 0.2 wt. part.

is used.

A lead frame is prepared by processing a copper plate with a thickness of 500 $\mu$m by etching and nickel plating and then this lead frame is arranged within a metal mold as shown in FIG. 6A. Then a composition for substrate materials described above is cast into the metal mold in which the lead frame is arranged. Continuously the composition for substrate materials within the metal mold is heated and pressurized under the conditions of 5 MPa and 175° C. so that the composition for substrate materials flows into the gaps with the lead frame before curing. Thereby a heat conductive substrate integrated with the lead frame is gained as shown in FIG. 6B.

The outer periphery of the lead frame of this heat conductive substrate is cut off, and the bending process of the terminals is carried out and the heat conductivity is measured. The resultant measurement shows the value of 3.7 W/mK to make sure that the gained heat conductivity is about twice as large as that gained in general for conventional injection molding or metal-based substrates.

For this example, a reflow test is carried out for 10 seconds at the maximum temperature of 260° C. as a reliability evaluation test. And, after that, adhesion at the interface between the substrate and the lead frame is detected by a supersonic inspection image device. As a result, no abnormality is recognized at the interface between the substrate and the lead frame to make sure that it has firm adhesion.

EXAMPLE OF APPLICATION 4

Using a composition for substrate materials manufactured in the same way as Embodiment 2d described above, an example of a heat conductive substrate in which a lead frame and a metal plate are integrated is described. In the present example:

inorganic powder: $Al_2O_3$ (trade name: AS-40, made by Showa Denko K.K., spherical grains with the average grain diameter of 12 $\mu$m), 90 wt. part thermosetting resin: brominated epoxy resin (trade name: NVR-1010, made by Nihon Rec Co., Ltd.), 9 wt. part other additives, methyl ethyl ketone as a solvent are prepared.

As for the above mentioned other additives, curing accelerator (imidazol, made by Nihon Rec Co., Ltd.) 0.05 wt. part, carbon black (made by Toyo Carbon Co., Ltd.) 0.4 wt. part coupling agent (PRENACT KR-46B, made by Ajinomoto Co., Inc.) 0.55 wt. part, are prepared.

As for methyl ethyl ketone, 10 wt. part to 100 wt. part of inorganic powder is prepared.

First of all, the materials comprising inorganic powder, thermosetting resin and other additives are mixed after methyl ethyl ketone, which is a solvent, is added. Then this mixture is dried for 20 minutes at 100° C. to evaporate methyl ethyl ketone into the air, and after that, it is crushed into fine pieces to prepare a composition for substrate materials.

On the other hand, the same lead frame as Example 3 is prepared and a metal plate gained by punching out an aluminum plate with a thickness of 300 $\mu$m is prepared. Then as shown in FIG. 7A, a lead frame is arranged within the metal mold before the composition for substrate materials is cast and a metal plate is arranged on the top side of the cast composition for substrate materials. After that, the composition for substrate materials within the metal mold is heated and pressurized through the metal plate under the conditions of 5 MPa and 175° C. so that the composition for substrate materials flows into gaps of the lead frame and then cured. Thereby, a heat conductive substrate integrated with the lead frame is gained as shown in FIG. 7B.

The outer periphery of the lead frame of this heat conductive frame is cut off and the bending process of the terminals is carried out to measure the heat conductivity. The resultant measurement indicates the value of 4.2 W/mK to make sure that the gained heat conductivity is about twice as large as the heat conductivity gained generally for conventional injection molding methods or metal-based substrates. In addition, since a metal plate functioning as a heat radiation plate is integrated and attached, the heat resistance is greatly lowered compared to the case without a metal plate.

And for this example, a reflow test is carried out for 10 seconds at the maximum temperature of 260° C. as a reliability evaluation test. After that, the adhesion at the interface between the substrate and the lead frame is detected by a supersonic inspection image device. As a result, no abnormality is recognized at the interface between the substrate and the lead frame to make sure that the adhesion is firm.

EXAMPLE OF APPLICATION 5

Using a composition for substrate materials manufactured in the same way as Embodiment 2b shown in Example 2, an example of heat conductive substrate, on both sides of which a wiring pattern comprising a metal foil is formed, is described. In this Example 5:

inorganic powder: $Al_2O_3$ (trade name: AM-28, made by Sumitomo Chemical Co., Ltd., spherical grains with the average grain diameter of 12 $\mu$m), 90 wt. part thermosetting resin: phenol resin (trade name: PHENOLITE VH4150, made by Dainippon Ink & Chemicals, Inc.), 9.5 wt. part other additives, are prepared.

As for the above mentioned other additives, carbon black (made by Toyo Carbon Co., Ltd.) 0.3 wt. part, coupling agent (trade name: PLENACT KR-55, made by Ajinomoto Co., Inc.), 0.2 wt. part, are prepared.

By mixing those materials and by sieving the mixture through 600 μm of opening diameter to granulate, a composition for substrate materials in a granulated powder condition is prepared.

Except for those materials, a copper foil with a thickness of 35 μm, one side of which is roughened is prepared as a metal foil.

First of all, as shown in FIG. 8A, a copper foil is arrange within the metal mold with its roughened surface above so that the roughened surface touches on the composition for substrate materials. Then the above composition for substrate materials is cast into the metal mold and then another copper foil is arranged on the upper side of the composition for substrate materials within the metal mold so that the roughened surface touches on the composition for substrate materials. After that, the composition for substrate materials within the metal mold is cured by heating and pressurizing through the copper foil under the conditions of 3 MPa and 180° C. so that at the same time the copper foils are integrated into the composition for substrate materials, respectively. Thereby, a heat conductive substrate shown in FIG. 8B is formed. In this case, the heat conductive cured body and the roughened surface of the copper foils are firmly adhered because phenol resin in the composition for substrate materials is cured.

After that, through-holes with the diameter of 0.3 mm are formed by a drill in the heat conductive substrate integrating the copper foils, on which the copper plating with the thickness of abort 20 μm is carried out for the entire surface including the through-holes. And the unnecessary parts of the copper foils are removed by etching to gain the heat conductive substrate.

The heat conductivity of this heat conductive substrate is measured. The resultant measurement indicates the value of 3.3 W/mK to make sure that the gained heat conductivity is nearly twice as large as the heat conductivity generally gained for the heat conductive substrates or metal-based substrates based on conventional injection molding methods.

For this example, a reflow test is carried out for 10 seconds at the maximum temperature of 260° C. as a reliability evaluate test to detect the adhesion at the interface between the substrate and the lead frame by a supersonic image inspection device. As a result no abnormality is recognized at the interface between the substrate and the lead frame to make sure that the adhesion is firm.

The present invention is described in detail with respect to the most favorite embodiments, but combinations and arrangements of the parts regarding the favorite embodiments can be modified in a variety of ways without deviating from the spirit and scope of this invention which is claimed in the following.

What is claimed is:

1. A process for manufacturing a composition for substrate materials, wherein 70–95 wt. % of inorganic powder and 5–30 wt. % of thermosetting resin composition including thermosetting resin which is in a solid condition at a room temperature are crushed into fine pieces and mixed.

2. A process for manufacturing a composition for substrate materials according to claim 1, wherein said thermosetting resin composition is in an uncured state when mixed with said inorganic powder.

3. A process for manufacturing a composition for substrate materials, comprising the steps of:

70–95 wt. % of inorganic powder and 5–30 wt. % of thermosetting resin composition including a thermosetting resin which is in a liquid condition at a room temperature are mixed; and a mixture prepared at the foregoing step is granulated.

4. A process for manufacturing a composition for substrate materials according to claim 3, wherein said thermosetting resin composition is in an uncured state when mixed with said inorganic powder.

5. A process for manufacturing a composition for substrate materials comprising the steps of:

70–95 wt. % of inorganic powder and 5–30 wt. % of thermosetting resin composition including a thermosetting resin which is in a liquid condition at a room temperature are mixed;

said thermosetting resin composition is turned into a B-stage by heat treating a mixture prepared at the foregoing step under a temperature condition lower than a curing temperature of said thermosetting resin; and said mixture gained as the B-stage into which said thermosetting resin composition is turned is crushed into fine pieces.

6. A process for manufacturing a composition for substrate materials according to claim 5, wherein said thermosetting resin composition is in an uncured state when mixed with said inorganic powder.

7. A process for manufacturing a composition for substrate materials comprising the steps of:

70–95 wt. % of inorganic powder and 5–30 wt. % of thermosetting resin composition including a thermosetting resin are mixed with a solvent in which said thermosetting resin is solved;

a mixture processed at the foregoing step is dried at a temperature lower than a curing temperature of said thermosetting resin to remove said solvent from said mixture; and said mixture from which said solvent is removed is crushed into fine pieces.

8. A process for manufacturing a composition for substrate materials according to claim 7 wherein said solvent includes at least one kind chosen from among methyl ethyl ketone, isopropanol and toluene.

9. A process for manufacturing a composition for substrate materials according to claim 7, wherein said thermosetting resin composition is in an uncured state when mixed with said inorganic powder.

* * * * *